(12) United States Patent
Yoshida et al.

(10) Patent No.: US 8,970,037 B2
(45) Date of Patent: Mar. 3, 2015

(54) TERMINAL STRUCTURE, AND SEMICONDUCTOR ELEMENT AND MODULE SUBSTRATE COMPRISING THE SAME

(71) Applicant: TDK Corporation, Tokyo (JP)

(72) Inventors: Kenichi Yoshida, Tokyo (JP); Makoto Orikasa, Tokyo (JP); Hideyuki Seike, Tokyo (JP); Yuhei Horikawa, Tokyo (JP); Hisayuki Abe, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 13/960,291

(22) Filed: Aug. 6, 2013

(65) Prior Publication Data

US 2014/0054769 A1    Feb. 27, 2014

(30) Foreign Application Priority Data

Aug. 24, 2012 (JP) .................. 2012-185031

(51) Int. Cl.
*H01L 23/485* (2006.01)
*H01L 23/492* (2006.01)
*H01L 23/00* (2006.01)

(52) U.S. Cl.
CPC ................ *H01L 24/13* (2013.01); *H01L 24/11* (2013.01); *H01L 24/03* (2013.01); *H01L 24/05* (2013.01); *H01L 2224/03462* (2013.01); *H01L 2224/0347* (2013.01); *H01L 2224/05022* (2013.01); *H01L 2224/05571* (2013.01); *H01L 2224/05655* (2013.01); *H01L 2224/11462* (2013.01); *H01L 2224/11464* (2013.01); *H01L 2224/1147* (2013.01); *H01L 2224/11849* (2013.01);

(Continued)

(58) Field of Classification Search
USPC ................... 257/737, 741, 766, 781, E23.02, 257/E23.021, E23.026
See application file for complete search history.

(56) References Cited

U.S. PATENT DOCUMENTS 6,417,089 B1 * 7/2002 Kim et al. ..................... 438/612
6,969,915 B2   11/2005 Tago et al.

(Continued)

FOREIGN PATENT DOCUMENTS

| EP | 2 629 323 A1 | 8/2013 |
| JP | A-2001-85456 | 3/2001 |

(Continued)

OTHER PUBLICATIONS

U.S. Appl. No. 13/960,228 in the name of Kenichi Yoshida et al., filed Aug. 6, 2013.

(Continued)

*Primary Examiner* — Victor A Mandala
(74) *Attorney, Agent, or Firm* — Oliff PLC (57) ABSTRACT

A preferred terminal structure comprises a base material; an electrode formed on the base material; an insulating covering layer formed on the base material and on the electrode and having an opening exposing at least part of the electrode; an under bump metal layer containing Ni, filling the opening on the electrode; and a dome-shaped bump containing Sn and Ti, covering the under bump metal layer, wherein at least part of the under bump metal layer has a portion sandwiched between the external electrode and the insulating covering layer.

5 Claims, 5 Drawing Sheets

(52) U.S. Cl.
CPC .............. *H01L2224/13017* (2013.01); *H01L 2224/13022* (2013.01); *H01L 2224/13111* (2013.01); *H01L 2224/13006* (2013.01)
USPC ........... 257/737; 257/741; 257/766; 257/781; 257/E23.02; 257/E23.021; 257/E23.026

(56) References Cited

U.S. PATENT DOCUMENTS

| | | | |
|---|---|---|---|
| 7,282,432 B2 | 10/2007 | Tago et al. | |
| 7,611,041 B2 | 11/2009 | Tago et al. | |
| 7,793,818 B2 | 9/2010 | Tago et al. | |
| 2003/0157792 A1 | 8/2003 | Tong et al. | |
| 2007/0028445 A1* | 2/2007 | Su et al. | 29/840 |
| 2009/0174052 A1 | 7/2009 | Sogawa et al. | |
| 2011/0316119 A1 | 12/2011 | Kim et al. | |
| 2013/0105971 A1* | 5/2013 | Daubenspeck et al. | 257/737 |
| 2014/0175642 A1* | 6/2014 | Choi et al. | 257/737 |

FOREIGN PATENT DOCUMENTS

| | | |
|---|---|---|
| JP | A-2002-203868 | 7/2002 |
| JP | A-2002-299366 | 10/2002 |
| JP | A-2006-093290 | 4/2006 |
| KR | 2002-0061528 | 7/2002 |

OTHER PUBLICATIONS

U.S. Appl. No. 13/960,173 in the name of Kenichi Yoshida et al., filed Aug. 6, 2013.
U.S. Appl. No. 13/960,330 in the name of Kenichi Yoshida et al., filed Aug. 6, 2013.
Nov. 18, 2014 Office Action issued in U.S. Appl. No. 13/960,228.

\* cited by examiner

TERMINAL STRUCTURE, AND SEMICONDUCTOR ELEMENT AND MODULE SUBSTRATE COMPRISING THE SAME

BACKGROUND OF THE INVENTION

1. Field of the Invention

The present invention relates to a terminal structure, and a semiconductor element and a module substrate comprising the same.

2. Related Background Art

In cases where an advanced semiconductor, such as a CPU (Central Processing Unit), is densely packaged, the transition proceeds from a packaging method using bonding wires, which is a general-purpose technique, to a flip chip packaging method in which bumps comprising solder and the like are formed on chip electrodes at a narrow pitch and directly bonded to a substrate. For example, methods for forming bumps on electrodes provided on a base material are disclosed in Patent Literature 1 (Japanese Patent Application Laid-Open No. 2001-085456) and Patent Literature 2 (Japanese Patent Application Laid-Open No. 2002-203868).

Figure 1:
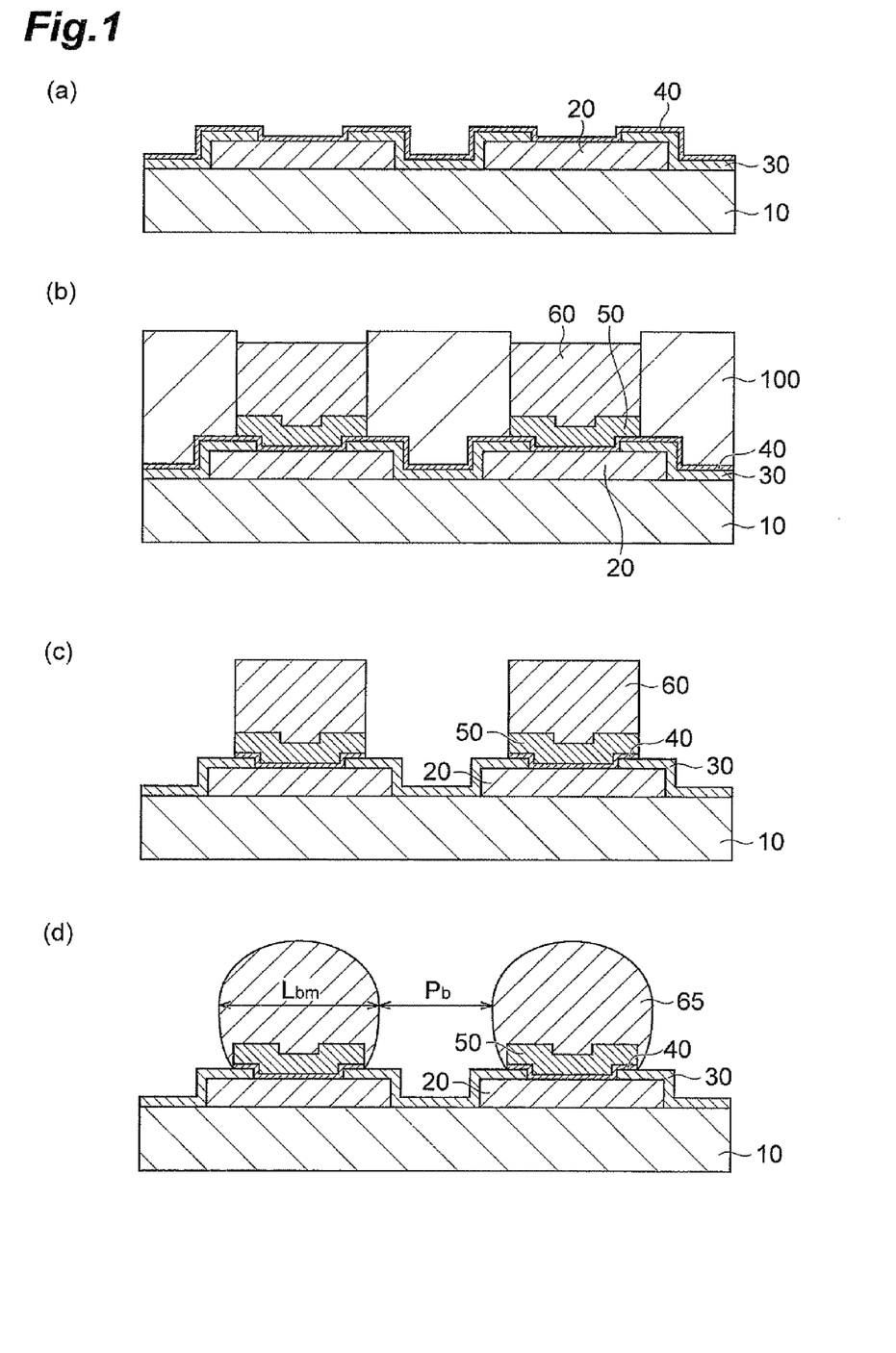

A general method for forming bumps on electrodes is shown in FIG. 1. In this method, first, as shown in FIG. 1(a), a substrate in which external electrodes 20, a passivation layer (insulating covering layer) 30, and a seed layer 40 are formed on a base material 10 is prepared. Next, a dry film 100 is formed so as to cover part of the seed layer, and electrolytic plating is performed in the order of electrolytic nickel plating and electrolytic solder plating to form under bump metal layers 50 and solder plating layers 60 (FIG. 1(b)). Then, the dry film is peeled, and the unnecessary seed layer is removed by etching (FIG. 1(c)). Then, by placing the entire substrate in a reflow furnace and heating it, bumps 65 are formed (FIG. 1(d)).

SUMMARY OF THE INVENTION

However, when bumps are thus formed by the conventional method, there is a tendency that the strength of the bump portions is less likely to be sufficiently obtained, for example, the bumps peel off the electrodes and the like easily.

Accordingly, the present invention has been made in view of such circumstances, and it is an object of the present invention to provide a terminal structure excellent in the strength of a bump portion, and a semiconductor element and a module substrate comprising this terminal structure.

In order to achieve the above object, the terminal structure of the present invention comprises a base material; an electrode formed on the base material; an insulating covering layer formed on the base material and on the electrode and having an opening exposing at least part of the electrode; an under bump metal layer containing Ni, filling the opening on the electrode; and a dome-shaped bump containing Sn, covering the under bump metal layer, wherein at least part of the under bump metal layer has a portion sandwiched between the external electrode and the insulating covering layer.

In the conventional bump forming step, for example, as shown in FIG. 1(d), the under bump metal layer is formed on the external electrode via the seed layer, but in order to form this seed layer, it is necessary that there is no depressed portion in the surface of the external electrode, the surface of the insulating covering layer, and the interface between the external electrode and the insulating covering layer, and therefore, usually, it is difficult to obtain high mechanical adhesiveness (anchor effect) on the seed layer surface. In addition, the adhesiveness of the seed layer itself may not be sufficient. As a result, there has been a problem that the adhesiveness of the under bump metal layer to the seed layer is poor, and the bump strength decreases.

On the other hand, in the terminal structure of the present invention, at least part of the under bump metal layer has a portion sandwiched between the external electrode and the insulating covering layer, and therefore, an anchor effect occurs due to this portion, and the peeling of the under bump metal layer from the external electrode becomes extremely unlikely to occur. Thus, the terminal structure of the present invention is excellent in the strength of the bump portion.

In the terminal structure of the present invention described above, the under bump metal layer may have a portion sandwiched between the external electrode and the insulating covering layer over an entire outer periphery thereof. Thus, the peeling of the under bump metal layer from the external electrode becomes even less likely to occur, and better strength of the bump portion is obtained.

Further, in the terminal structure of the present invention, the bump can further contain Ti. When the bump thus contains Sn and Ti in combination, it becomes possible to suppress the diffusion of the constituent metals of the bump into the under bump metal layer.

In addition, the present invention provides a semiconductor element and a module substrate comprising the terminal structure of the present invention described above. Such a semiconductor element and module substrate comprise the above terminal structure, and therefore have reduced breakage in the bump portion and are excellent in strength.

According to the present invention, it becomes possible to provide a terminal structure excellent in the strength of a bump portion, and a semiconductor element and a module substrate comprising this terminal structure.

BRIEF DESCRIPTION OF THE DRAWINGS

FIG. 1(a)-(d) is a view showing a general method for forming bumps on electrodes;

FIG. 4(a)-(d) is a cross-sectional view schematically showing a preferred step of forming a terminal structure according to this embodiment.

DESCRIPTION OF THE PREFERRED EMBODIMENTS

Preferred embodiments of the present invention will be described below referring to the drawings in some cases. In the drawings, the same numerals are given to the same or equivalent elements, and redundant descriptions are omitted. In addition, all of the descriptions of top, bottom, left, right, and the like are based on the drawings.

[Terminal Structure]

Figure 2:
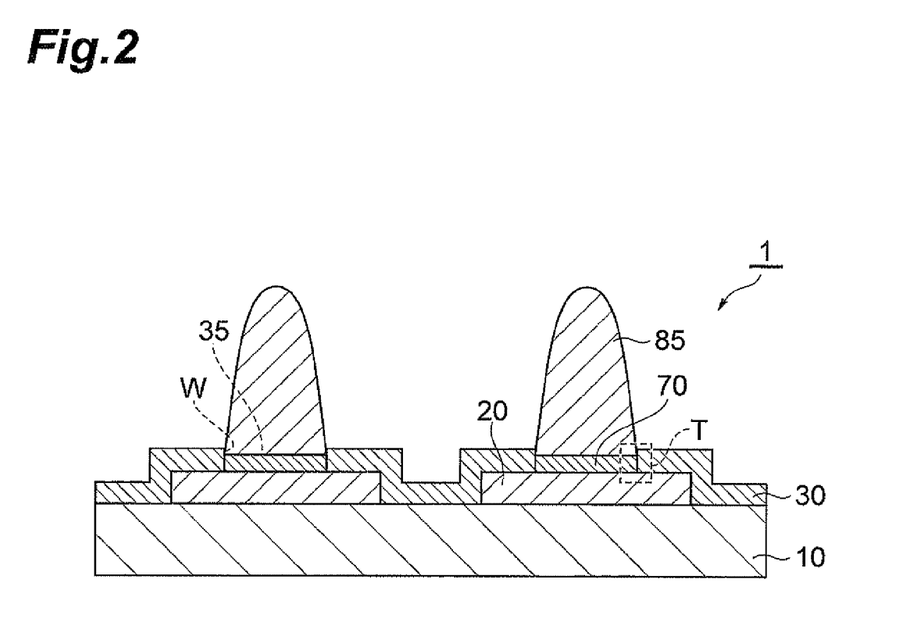
FIG. 2 is a view schematically showing the cross-sectional configuration of a terminal structure according to a preferred embodiment.

First, a terminal structure according to a preferred embodiment will be described. FIG. 2 is a view schematically showing the cross-sectional configuration of the terminal structure according to the preferred embodiment.

As shown in FIG. 2, a terminal structure 1 comprises a base material 10, external electrodes 20 formed on the base material 10, an insulating covering layer 30 formed on the base material 10 and the external electrodes 20, under bump metal layers (hereinafter described as "UBM layers") 70 formed on the external electrodes 20, and dome-shaped bumps 85 formed on the UBM layers 70.

The base material 10 is an insulating base material. Examples of such an insulating base material include silicon substrates and organic substrates. The external electrode 20 is, for example, a portion that is to be a terminal for making connection to another element, in a predetermined circuit pattern provided on the base material 10. This external electrode 20 is composed of a known material that can constitute a circuit pattern and a portion that is its terminal. The external electrode 20 comprises, for example, Cu, a Cu alloy, Al, or an Al alloy.

The thickness of the external electrode 20 and the pitch of the external electrodes 20 (arrangement spacing; the distance between the centers of neighboring external electrodes 20 (Pe in FIG. 4(a))) are not particularly limited, and can be set to, for example, 1 to 30 μm and 10 to 500 μm, respectively. By setting such a thickness and pitch, the formation of the external electrodes 20 becomes easy, and in addition, arranging the bumps closer to each other, that is, the narrowing of the pitch of the bumps becomes possible. When the narrowing of the pitch of the bumps becomes possible in the terminal structure 1, the miniaturization of a semiconductor device and an electronic device obtained by using this terminal structure 1 becomes possible.

The insulating covering layer 30 is provided so as to cover the entire base material 10 and the vicinity of the peripheral edge portions of the external electrodes 20, and has openings 35 so that parts of the external electrodes 20 are exposed. The insulating covering layer 30 is thus basically provided so as to cover the entire base material 10 and external electrodes 20 in portions other than the openings 35. In other words, as the insulating covering layer 30 covers regions other than the portions that are to be the terminals of the circuit pattern provided on the base material 10 (the external electrodes 20), the insulation of the circuit pattern other than these portions that are to be the terminals from the outside can be promoted.

The insulating covering layer 30 is not particularly limited as long as it is composed of an insulating material that can protect the base material 10 and the external electrodes 20 from corrosion due to moisture and the like. Examples of the insulating covering layer 30 include those comprising polyimide, SiN, and the like.

The planar shape (the shape as viewed from the upper side) of the opening 35 in the insulating covering layer 30 is not particularly limited, and examples thereof include various shapes, such as circles and polygons. In addition, the UBM layer 70 and the bump 85 are formed in the opening 35, and therefore can have a planar shape similar to that of the opening 35. In this embodiment, the opening 35, the UBM layer 70, and the bump 85 are described as having a circular planar shape though not shown. Note that when the planar shape of the opening 35 is a polygon, the diameter of the opening 35 and the like may be, for example, a maximum length of a line of intersection between a plane of the polygon and a plane perpendicular to the plane of the polygon including a line passing through substantially the center of the polygon.

The thickness of the insulating covering layer 30, the diameter of the opening 35 (Lo in FIG. 4(a)), and the distance between neighboring openings 35 (Po in FIG. 4(a)) are not particularly limited, and can be set to 0.1 to 50 μm, 3 to 150 μm, and 5 to 350 μm, respectively. The thickness of the insulating covering layer 30 refers to the distance from the surface of the layer (the base material 10 or the external electrode 20 in FIG. 2) on which the insulating covering layer 30 is formed to the upper surface of the insulating covering layer 30. When there are variations in this thickness, it is preferred that the smallest value satisfies the above range.

The UBM layer 70 is provided so as to fill the opening 35 in the insulating covering layer 30. Here, the state in which the UBM layer 70 fills the opening 35 refers to a state in which the UBM layer 70 is provided so as to cover the entire surface of the external electrode 20 exposed in the opening 35. The UBM layer 70 need not fill up the entire opening 35 (that is, the upper surface of the UBM layer is lower than the upper surface of the insulating covering layer 30 in the peripheral edge portion of the opening 35), and may be formed so as to fill up the entire opening 35. In addition, the UBM layer 70 may be formed so as to cover not only in the opening 35 but also a part on the insulating covering layer 30 around the opening 35.

The UBM layer 70 is a layer containing Ni and may be a layer containing Ni and P from the viewpoint of suppressing the diffusion of the metal constituting the bump into the external electrode. When the UBM layer 70 contains 5 to 15 mass % of P in addition to Ni, it easily becomes a layer in which flexibility is high with low stress. The UBM layer 70 containing P in such a proportion can be formed, for example, by electroless nickel plating described below. The UBM layer 70 may further contain S and the like in addition to Ni and P.

The bump 85 has a shape in which the upper surface of the bump 85 is a curved surface raised toward the upper side, that is, a dome-shaped shape. The bump 85 can have a shape in which the diameter in the direction perpendicular to the height direction of the bump 85 decreases gradually toward the upper side. Thus, neighboring bumps 85 are less likely to come into contact with each other even if they are close to each other, and therefore, the narrowing of the pitch of the bumps becomes easy.

The height of the bump 85 can be set to 5 to 50 μm with respect to the surface of the external electrode 20 from the viewpoint of bringing the bump 85 into sufficient and suitable contact with a connection terminal in packaging.

The bump 85 has a composition containing at least Sn. In addition, the bump 85 may further contain Ti in addition to Sn. When the bump 85 thus contains Ti in addition to Sn, it becomes possible to suppress the constituent metals of the bump 85 from diffusing into the UBM layer 70. In addition, the bump 85 may further contain P, S, and the like other than Sn and Ti. Examples of a preferred composition of the bump 85 include a composition containing 1 to 100 ppm of Ti and 1 to 10 ppm of other elements in total, with the balance being Sn. The bump 85 preferably has a composition containing substantially no Au, Ag or Cu. The bump 85 containing these metals may be more brittle than one not containing these metals, and therefore, by providing a composition containing substantially no Au, Ag or Cu, the bump 85 having higher strength tends to be easily obtained. The "composition containing substantially no Au, Ag or Cu" is a composition obtained without intentionally adding these elements at the time of the formation of the bump 85. Therefore, when slight amounts of these elements are inevitably mixed during manufacture, the composition can be regarded as a "composition containing substantially no Au, Ag or Cu."

Figure 3:
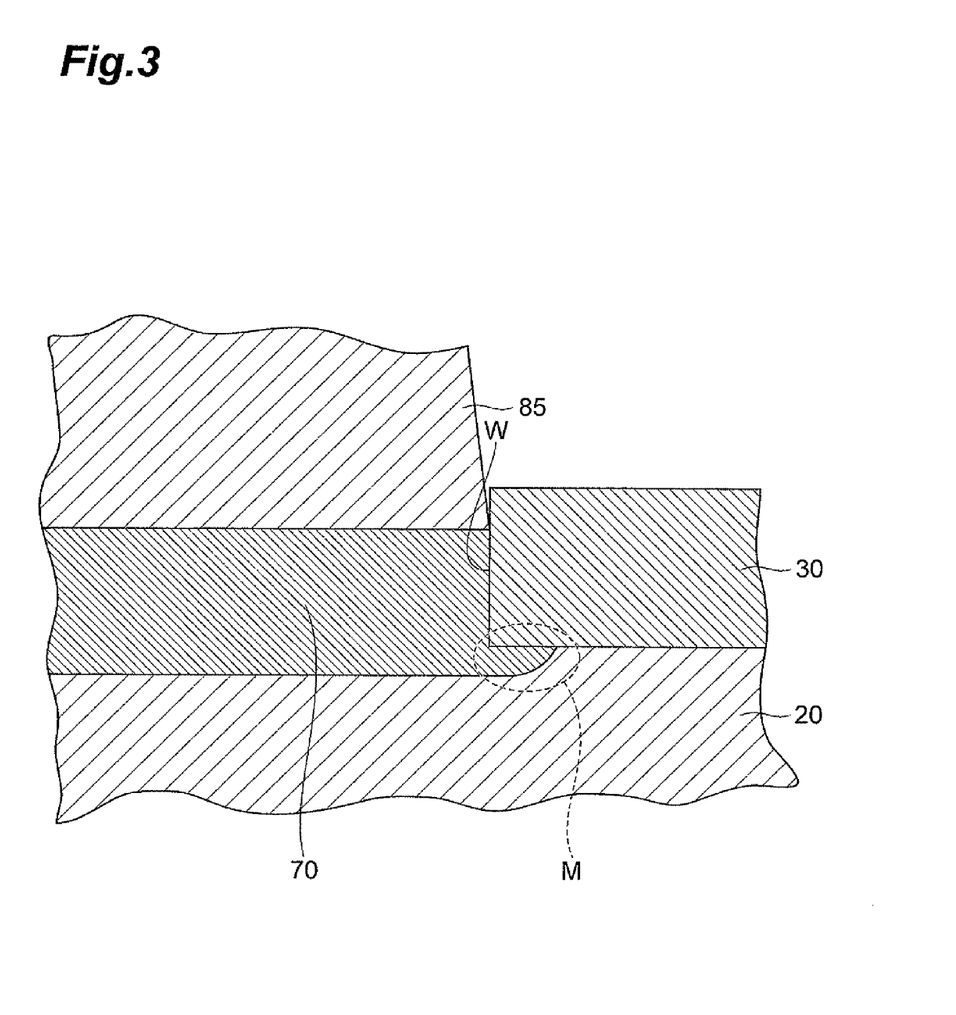
FIG. 3 is a view enlarging and schematically showing the cross-sectional configuration of a portion in which an under bump metal layer 70 is sandwiched between an external electrode 20 and an insulating covering layer 30.

Although not clearly shown in FIG. 2, in the terminal structure 1 in this embodiment, at least part of the UBM layer 70 has a portion sandwiched between the external electrode 20 and the insulating covering layer 30, in the lamination direction of the terminal structure 1. FIG. 3 is a view enlarging and schematically showing the cross-sectional configuration of a portion in which the UBM layer 70 is sandwiched between the external electrode 20 and the insulating covering layer 30. This region shown in FIG. 3 corresponds to the region denoted by T in FIG. 2.

The UBM layer 70 is thus sandwiched between the external electrode 20 and the insulating covering layer 30 so that the edge portion M of the UBM layer 70 protrudes outside (insulating covering layer 30 side) the inner wall W of the opening 35 in the insulating covering layer 30. The edge portion M of such an UBM layer 70 is in a state of entering under the bottom surface of the insulating covering layer 30. As the edge portion M of the UBM layer 70 is sandwiched between the external electrode 20 and the insulating covering layer 30 in this manner, the anchor effect of this portion occurs, and as a result, the peeling of the UBM layer 70 from the external electrode 20 becomes extremely unlikely to occur. Further, this effect is also obtained by making the opening 35 in the insulating covering layer 30 small, and therefore, the narrowing of the pitch of the bumps 85 becomes easy.

The UBM layer 70 should have a portion sandwiched between the external electrode 20 and the insulating covering layer 30 in at least a portion of the outer periphery of the UBM layer 70, and from the viewpoint of obtaining the strength of the portion of the bump 85 better, the UBM layer 70 preferably has a portion sandwiched between the external electrode 20 and the insulating covering layer 30 over the entire outer periphery of the UBM layer 70.

The UBM layer 70 can protrude outside from the inner wall W of the opening 35 in the insulating covering layer 30 by 0.5 to 10 µm. When the edge portion M of the UBM layer 70 is sandwiched between the external electrode 20 and the insulating covering layer 30 so as to satisfy such a condition, the peeling of the UBM layer 70 and the bump portion as well can be suppressed well.

In addition, in the terminal structure 1 in this embodiment, not only the UBM layer 70 but also the bump 85 formed on the UBM layer 70 may have a portion sandwiched between the external electrode 20 and the insulating covering layer 30 in a form similar to that of the UBM layer 70. Thus, the peeling of the bump 85 from the UBM layer 70 is also effectively reduced, and the strength of the bump portion can be further improved. However, when the bump 85 is formed by the reflow of a tin plating layer 80 in a method for manufacturing the terminal structure 1 as described below, the bump 85 of good dome shape may not be obtained in a state in which the edge portion of the tin plating layer 80 is not exposed. Therefore, depending on the shape of the bump 85, there are cases where the bump 85 preferably does not have a portion sandwiched between the external electrode 20 and the insulating covering layer 30.

[Method for Manufacturing Terminal Structure]

Next, a preferred embodiment of a method for manufacturing a terminal structure having the above-described configuration will be described.

Figure 4:
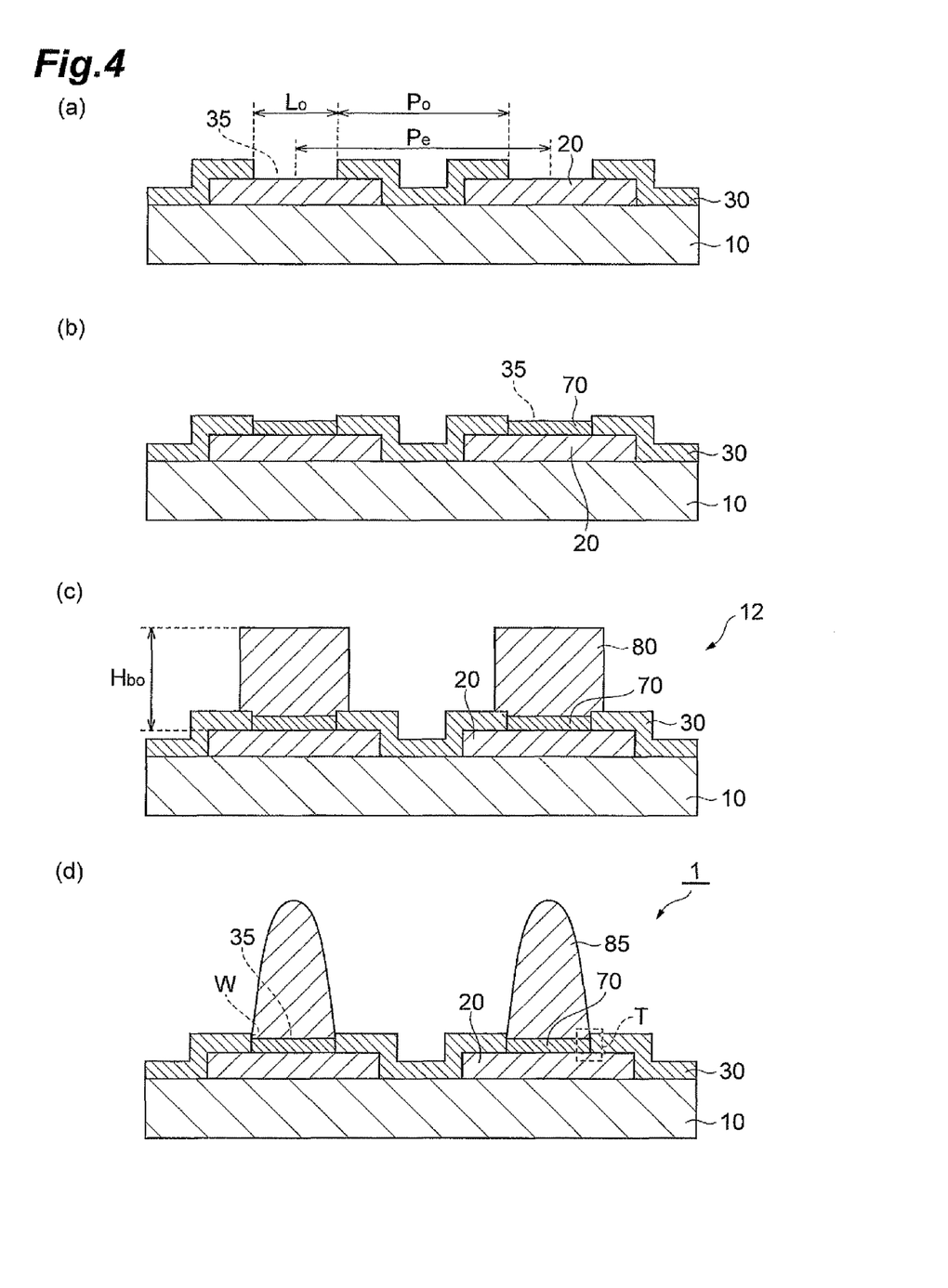

FIG. 4 is a cross-sectional views schematically showing a preferred step of forming a terminal structure according to this embodiment. First, as shown in FIG. 4(a), external electrodes 20 and insulating covering layer 30 are formed on base material 10 using a known method. At this time, the thickness and pitch Pe of the external electrodes 20, the thickness of the insulating covering layer 30, the diameter Lo of the opening 35, and the spacing Po between the openings 35 are adjusted to be in the ranges as described above, respectively.

Next, it is preferred to perform etching on the surfaces of the external electrodes 20 exposed in the openings 35 in the insulating covering layer 30. By performing such etching, parts of the external electrodes 20 under the insulating covering layer 30 in the vicinity of the openings 35 can be removed. By doing this, UBM layers 70 enter into the portions of the external electrodes 20 removed by the etching, in the step of forming the UBM layers 70 described below. As a result, structures in which the edge portions M of the UBM layers 70 are sandwiched between the external electrodes 20 and the insulating covering layer 30 are easily formed. In addition, it also becomes possible to provide unevenness on the surfaces of the external electrodes 20 by etching, and as a result, the external electrodes 20 and the UBM layers 70 formed on the external electrodes 20 can be strongly adhered to each other. As a method for forming such structures, methods of removing the surfaces of the external electrodes 20 other than etching can also be applied.

The etching can be performed using, for example, an etchant containing an inorganic acid, such as hydrochloric acid, nitric acid, or sulfuric acid, an organic acid, such as oxalic acid, citric acid, or gluconic acid, an inorganic salt, such as a chloride salt or a persulfate, or the like. In addition, for example, by adding a surfactant and the like to the etchant or performing the stirring of the etchant and the ultrasonic irradiation of the etchant for the purpose of preferably forming the above structures, the etchant can be infiltrated into the fine portions of the openings.

Then, as shown in FIG. 4(b), the UBM layers 70 containing Ni are formed on the surfaces of the external electrodes 20 exposed in the openings 35 in the insulating covering layer 30 after known pretreatments are performed as required. Examples of the above-described pretreatments include degreasing, pickling, and activation treatments in cases where the external electrodes 20 comprise Cu or a Cu alloy. In addition, examples of the above-described pretreatments include degreasing, pickling, and zincate treatments in cases where the external electrodes comprise Al or an Al alloy. In addition, the degreasing or pickling treatment may be performed before the above-described etching treatment as required. The order and number of the steps of these pretreatments can be appropriately adjusted as required.

Examples of the method for forming the UBM layers 70 include a method using electroless nickel plating. The electroless nickel plating can be performed using, for example, a plating solution containing a nickel salt, a complexing agent, a reducing agent, and the like. From the viewpoint of improving the workability (bath stability and deposition rate) of the electroless nickel plating, it is preferred to use a plating solution containing hypophosphorous acid as a reducing agent.

Next, as shown in FIG. 4(c), tin plating layers 80 are formed on the UBM layers 70. Thus, a precursor substrate 12 for obtaining the desired terminal structure 1 is obtained. The tin plating layers 80 can be formed, for example, by reductive electroless tin plating. The details of a preferred aspect of the reductive electroless tin plating will be described below.

The tin plating layers 80 may be formed so as to cover not only the UBM layers 70 but the peripheries of the openings 35 in the insulating covering layer 30, as shown in FIG. 4(e). In addition, the height of the tin plating layer 80 with respect to the surface of the external electrode 20 ($H_{bo}$ in FIG. 4(c)) is preferably set to 5 to 40 µm.

As a result of the study of the present inventors, it has become clear that the terminal structure 1 in this embodiment is particularly easily implemented by forming such tin plating layers 80 by reductive electroless tin plating. In other words, when the precursor substrate 12 for obtaining the terminal structure 1 in this embodiment is manufactured, the tin plating layers 80 can be formed by reductive electroless tin plating, and therefore, it is not necessary to previously form a seed layer, which is necessary when conventional electrolytic solder plating is performed. Therefore, at the time of the formation of the UBM layers 70, the UBM layers 70 can be formed so as to fill the openings 35 on the external electrodes 20 without via a seed layer, as shown in FIG. 4(b). At this time, the UBM layers 70 are formed, for example, by electroless nickel plating as described above, and therefore, when there are depressed portions that are to be gaps at the interfaces between the surfaces of the external electrodes 20 and the insulating covering layer 30 (that is, there are portions in which the lower surfaces of the end portions of the insulating covering layer 30 on the opening sides are not in contact with the external electrodes 20), the UBM layers 70 are formed on the external electrodes 20 in the portions. As a result, it becomes possible to form structures in which the edge portions M of the UBM layers 70 are sandwiched between the external electrodes 20 and the insulating covering layer 30.

On the other hand, as shown in FIG. 1, in a precursor substrate formed in a conventional technique, it is necessary to previously form a seed layer 40 in order to perform electrolytic solder plating. But, when there are depressed portions that are to be gaps at the interfaces between the external electrodes 20 and the insulating covering layer 30, such a seed layer 40 cannot be twilled. Therefore, in the conventional method, a terminal structure having structures in which the edge portions of UBM layers are sandwiched between external electrodes and an insulating covering layer, as in this embodiment, cannot be obtained. In addition, for a similar reason, in the terminal structure in this embodiment, even if the surfaces of the external electrodes have larger unevenness than in the case of the conventional terminal structure, the UBM layers can be formed well, and therefore, the terminal structure can be preferably manufactured.

Here, reductive electroless tin plating preferred for forming the tin plating layers 80 will be described.

The reductive electroless tin plating can be performed using, for example, a reductive electroless tin plating solution containing a tin compound, an organic complexing agent, an organic sulfur compound, an antioxidant, and a titanium compound as a reducing agent. By preferably selecting the type and concentration of these constituents of the reductive electroless tin plating solution, it is possible to stably deposit the tin plating layers 80 on the UBM layers 70. The details will be shown below, but the type, the concentration and the mechanism are not limited to those described.

The tin compound contained in the plating solution for reductive electroless tin plating is not particularly limited as long as it is a supply source of tin, and one or two or more selected from the group consisting of inorganic acid salts, carboxylates, alkanesulfonates, alkanolsulfonates, and hydroxides of tin, and metastannic acid are preferred. One of these water-soluble tin compounds can be used, or two or more of these water-soluble tin compounds can be mixed and used.

The valence (oxidation number) of tin in the tin compound may be either divalent or tetravalent. However, from the viewpoint that the deposition rate is good, the valence of tin can be divalent. In other words, stannous compounds are preferred.

The content of the tin compound in the reductive electroless tin plating solution is not particularly limited, and is preferably 0.5 g/L to 100 g/L, more preferably 5 g/L to 30 g/L, and still more preferably 7 g/L to 15 g/L, as metal tin, based on the entire plating solution. When the content of the metal tin in the reductive electroless tin plating solution is 0.5 g/L or more, it is possible to increase the deposition rate of tin coatings at a practical level. In addition, when the content of the metal tin in the reductive electroless tin plating solution is 100 g/L or less, the tin compound as a tin source can be easily dissolved.

The organic complexing agent is not particularly limited, and phosphonic acid compounds containing phosphorus in which the oxidation number is trivalent, such as organic phosphonic acid compounds, can be used. Examples of such an organic complexing agent include amino group-containing methylenephosphonic acids, such as nitrilotrimethylenephosphonic acid, ethylenediaminetetramethylenephosphonic acid, diethylenetriaminepentamethylenephosphonic acid, hexamethylenediaminetetramethylenephosphonic acid, and hexamethylenetriaminepentamethylenephosphonic acid; hydroxyl group-containing phosphonic acids, such as 1-hydroxyethylidene-1,1-diphosphonic acid; benzenephosphonic acids, such as 3-methoxybenzenephosphonic acid; benzylphosphonic acids, such as 3-methylbenzylphosphonic acid and 4-cyanobenzylphosphonic acid; alkali metal salts thereof; alkaline-earth metal salts thereof; and ammonium salts thereof. Among these, hydroxyl group-containing phosphonic acids are more preferred. For the organic complexing agent, one of these can be used, or two or more of these can be mixed and used.

The content of the organic complexing agent in the reductive electroless tin plating solution is not particularly limited, and is preferably 1 g/L to 500 g/L, more preferably 10 g/L to 200 g/L, and still more preferably 50 g/L to 150 g/L, based on the entire reductive electroless tin plating solution. When the content of the organic complexing agent in the reductive electroless tin plating solution is 1 g/L or more, the organic complexing agent has sufficient complexing power, and therefore, the plating solution can be stabilized, and the effect as a complexing agent can be sufficiently exhibited. In addition, when the content is 500 g/L or less, the organic complexing agent is easily dissolved in water. Even if the content of the organic complexing agent is set to 500 g/L or more, no further increase in the effect as a complexing agent is seen, which may be uneconomical in terms of cost.

Examples of the organic sulfur compound include organic sulfur compounds selected from the group consisting of mercaptans and sulfides. The "mercaptans" are compounds having a mercapto group (—SH) in the molecule. The "sulfides" are compounds having a sulfide group (—S—) in the molecule. Examples of a group bonded to S in the sulfides include alkyl groups, aryl groups, and alkanoyl groups, such as an acetyl group (ethanoyl group). In addition, polysulfides in which a plurality of "—S-" are directly bonded, such as disulfides and trisulfides, are also included in the sulfides. In both of the mercaptans and the sulfides, the lone pairs of the S atom are active, and therefore, they can act as a catalyst for tin deposition on the UBM layers 70 (on the coatings containing Ni). As a result, it becomes possible to stably deposit tin on the UBM layers 70.

The content of the organic sulfur compound in the reductive electroless tin plating solution is not particularly limited, and is preferably 0.1 ppm to 100000 ppm, more preferably 1 ppm to 10000 ppm, and still more preferably 5 ppm to 1000 ppm, based on the entire reductive electroless tin plating solution. When the content of the organic sulfur compound in the reductive electroless tin plating solution is 0.1 ppm or more, sufficient deposition rate can be ensured. On the other hand, when the content is 100000 ppm or less, the organic sulfur compound is easily dissolved in water, and therefore, a stable plating solution can be obtained.

The antioxidant is not particularly limited as long as it can prevent tin in which the valence (oxidation number) is divalent from being oxidized to tetravalent tin. Examples of the antioxidant include phosphoric acid-containing compounds (hypophosphorous acid compounds and phosphorous acid compounds), hydrazine derivatives, catechol, hydroquinone, pyrogallol, or salts thereof. Among these, phosphoric acid-containing compounds are preferred, and phosphorous acid compounds are more preferred.

One of these antioxidants can be used, or two or more of these antioxidants can be mixed and used. By adding the antioxidant, not only the oxidation of tin described above can be prevented, but also excessive oxidation of trivalent titanium described below can be suppressed. Thus, a stable plating solution can be obtained, and it becomes possible to stably deposit tin on the UBM layers 70 (on the coatings containing Ni).

The content of the antioxidant in the reductive electroless tin plating solution is not particularly limited, and is preferably 0.1 g/L to 100 g/L, more preferably 1 g/L to 80 g/L, based on the entire reductive electroless tin plating solution. When the content of the antioxidant in the reductive electroless tin plating solution is 0.1 g/L or more, the effect of the antioxidant can be sufficiently ensured, and when the content is 100 g/L or less, tin can be suppressed from depositing abnormally in the reductive electroless tin plating solution, and therefore, it is possible to perform stable tin plating in which the bath stability is good.

The titanium compound is not particularly limited as long as it is water-soluble and acts as a reducing agent. As the titanium compound, for example, titanium halides, such as titanium trichloride, titanium triiodide, and titanium tribromide; and titanium sulfate have high plating performance and tend to be easily available. The valence (oxidation number) of titanium is preferably trivalent. This is because divalent titanium compounds are unstable and may be easily oxidized and change to tetravalent titanium compounds, and tetravalent titanium compounds themselves are not oxidized, and therefore, the supply of electrons may be impossible. One of these water-soluble titanium compounds can be used, or two or more of these water-soluble titanium compounds can be mixed and used. Among these, titanium trichloride has high plating performance and tends to be easily available.

The content of the titanium compound in the reductive electroless tin plating solution is not particularly limited, and is preferably 0.01 g/L to 100 g/L, more preferably 0.1 g/L to 20 g/L, and still more preferably 1 g/L to 10 g/L, as metal titanium, based on the entire reductive electroless tin plating solution. When the content of the titanium compound in the reductive electroless tin plating solution is 0.01 g/L or more, it is possible to set the deposition rate of tin coatings to a practical speed. In addition, when the content of the titanium compound in the reductive electroless tin plating solution is 100 g/L or less, tin can be suppressed from depositing abnormally, and therefore, it is possible to perform stable tin plating in which the bath stability is good.

Other than these components, a buffer for keeping the pH of the plating solution constant, a surfactant for pinhole elimination in tin plating coatings or for making the defoaming of the plating solution good, a brightening agent for making tin plating coatings smoother, and the like can be appropriately contained in the reductive electroless tin plating solution as required.

The plating conditions in the reductive electroless tin plating are not particularly limited, and the temperature condition can be set to 40° C. to 90° C., preferably 50° C. to 80° C. In addition, the plating time can be set to 30 seconds to 5 hours, preferably 1 minute to 2 hours.

After the tin plating layers 80 are formed as described above, the precursor substrate 12 is subjected to, for example, high temperature treatment (reflow) in a nitrogen atmosphere, to melt the tin plating layers 80, and further, the tin plating layers 80 are quenched and solidified to form dome-shaped bumps 85 (FIG. 4(*d*)). The terminal structure 1 having the structure shown in FIG. 2 can be thus obtained. There are no particular limitations on the reflow conditions, and atmosphere: an oxygen concentration of 1000 ppm or less, temperature: 235 to 300° C., and holding time: 5 to 120 seconds are preferred. Due to the high temperature treatment, the portions in the bumps 85 close to the boundaries with the UBM layers 70 may be composed of an intermetallic compound containing tin as a main component (50 mass % or more). In this case, this intermetallic compound containing tin as a main component is also regarded as parts constituting the bumps 85.

[Semiconductor Element]

The terminal structure 1 having the configuration as described above can be preferably applied to a semiconductor element or the like. For example, in the case of a semiconductor element, as the base material 10, one in which a semiconductor circuit is formed on a surface of or inside a silicon substrate or the like can be applied. In addition, as the external electrode 20, one electrically connected to a semiconductor circuit can be applied. Trenches or steps may be provided on the surface of the silicon substrate or the like. In this case, the external electrodes 20 may be formed on sites having the above-described trenches or steps. In other words, the external electrodes 20 may be formed, for example, on the bottom surfaces of the trenches (depressed portions), the upper surfaces of the steps (raised portions), or the bottom surfaces of the steps (depressed portions). Alternatively, the external electrodes 20 may be formed on surfaces generally perpendicular to the major surface of the silicon substrate or the like. In other words, the external electrodes 20 may be formed, for example, on the side surfaces of the silicon substrate or the like, or the side surfaces of the trenches or the steps. In such a semiconductor element, adjacent bump spacing can be narrowed, and therefore, it is possible to sufficiently meet a demand for the miniaturization of semiconductor devices.

[Module Substrate]

In addition, the terminal structure 1 having the configuration as described above can also be preferably applied to a module substrate or the like in which a semiconductor element or the like is mounted. For example, in the case of a module substrate, as the base material 10, one in which a wiring circuit is formed on a surface of or inside an organic substrate or the like can be applied. In addition, as the external electrode 20, one electrically connected to a wiring circuit can be applied. In such a module substrate, adjacent bump spacing can be narrowed, and therefore, it is possible to sufficiently meet a demand for the miniaturization of electronic devices.

EXAMPLES

The contents of the present invention will be described in more detail below using Examples and Comparative Examples, but the present invention is not limited to the following Examples.

Example 1

Preparation of Base Material

First, a base material 10 (5×5 mm, thickness 0.6 mm) on which external electrodes 20 and an insulating covering layer 30 were formed, as shown in FIG. 4(a), was prepared. The material of the base material 10, the material and pitch Pe of the external electrodes 20, the material and thickness of the insulating covering layer 30, and the diameter Lo of an opening 35 and the distance Po between the openings 35 in the insulating covering layer 30 were set as shown in Table 1. 10×10 (number) of the openings were arranged with equal spacing between each other. In addition, the external electrodes 20 were fabricated so as to be previously wired so that a daisy circuit was formed at the time of packaging for the confirmation of conduction properties in the evaluation of the strength of bump portions described below. Further, all of the diameter, height, distance, and the like of each component were measured by observing using a scanning electron microscope (SEM) or the like. In Table 1, for the material of the external electrode 20, the "Cu foil" indicates one formed by etching copper foil previously provided on the base material 10, and the "Cu plating" indicates one formed by directly performing Cu plating on the base material 10.

(Etching)

Next, etching was performed on the surfaces of the external electrodes 20 exposed in the openings 35 in the insulating covering layer 30 to remove parts of the surfaces of the external electrodes 20. The etching was performed by performing immersion for 1 minute while performing irradiation with ultrasonic waves, at a temperature of 30° C., using an etchant containing sulfuric acid, sodium persulfate, and the like. The thickness from the surface of the external electrode 20 removed by the etching (removal thickness) was set as shown in Table 1.

(Electroless Nickel Plating)

Next, as shown in FIG. 4(b), electroless nickel plating was performed on the surfaces of the external electrodes 20 exposed in the openings 35 in the insulating covering layer 30, after the etching, to form UBM layers 70 filling the openings 35 in the insulating covering layer 30. The thickness of the UBM layer 70 formed in this manner was as shown in Table 1.

The electroless nickel plating was performed using a known electroless nickel-phosphorus plating solution (phosphorus concentration in UBM: 10 mass %). In addition, for the plating conditions, the temperature condition was set to 85° C., and the plating time was adjusted so that the predetermined nickel plating layer thickness was obtained.

(Reductive Electroless Tin Plating)

Next, as shown in FIG. 4(c), reductive electroless tin plating was performed to form tin plating layers 80 so that the UBM layers 70 and part of the insulating covering layer 30 were covered, to obtain a precursor substrate 12. The thickness of the tin plating layer 80 formed in this manner (the height from the surface of the UBM layer 70) was as shown in Table 1.

The composition of the reductive electroless tin plating solution was as shown below. In addition, for the plating conditions, the temperature condition was set to 60° C., and the plating time was adjusted so that the predetermined tin plating layer height was obtained.

Tin compound (stannous chloride): 10 g/L (as tin)
Phosphorus-containing organic complexing agent (hydroxyl group-containing phosphonic acid): 100 g/L
Organic sulfur compound (sulfide group-containing organic sulfur compound): 100 ppm
Antioxidant (phosphorous acid compound): 40 g/L
Reducing agent (titanium trichloride): 5 g/L (as titanium)

(Reflow)

The precursor substrate 12 obtained as described above was held in a nitrogen atmosphere (oxygen concentration 500 ppm) at 250° C. for 30 seconds to melt the tin plating layers 80, and further, the tin plating layers 80 were quenched and solidified to obtain a TEG substrate comprising a terminal structure 1 having dome-shaped bumps 85 as shown in FIG. 4(d) (the terminal structure of Example 1). The height of the bump 85 obtained by the reflow (the height from the upper surface of the insulating covering layer 30 on the external electrode 20), the diameter when the bump 85 was viewed from the top side, and the Ti content in the bump 85 were as shown in Table 1. The Ti content in the bump 85 was measured by dissolving the bump in the obtained terminal structure in an acid, performing extraction, performing the inductively coupled plasma-atomic emission spectroscopy of the extraction liquid, and calculating the amount of Ti relative to the amount of Sn.

Examples 2 to 11

TEG substrates comprising the terminal structures of Examples 2 to 11 were manufactured as in Example 1 except that the elements of the terminal structure were changed to those shown in Table 1.

Comparative Example 1

Preparation of Base Material

First, a base material on which external electrodes and an insulating covering layer were formed was prepared as in Example 1. The material of the base material, the material and pitch Pe of the external electrodes, the material and height (height from the external electrode surface) of the insulating covering layer, and the diameter of an opening and the distance between the openings in the insulating covering layer were set as shown in Table 1.

(Etching)

Next, etching was performed on the surfaces of the external electrodes exposed in the openings in the insulating covering layer to remove parts of the surfaces of the external electrodes. The etching was performed by performing immersion for 1 minute while performing irradiation with ultrasonic waves, at a temperature of 30° C., using an etchant containing sulfuric acid, sodium persulfate, and the like. The thickness from the surface of the external electrode 20 removed by the etching (removal thickness) was set as shown in Table 1.

(Electrolytic Nickel Plating)

Next, an attempt was made to form a 0.1 μm thick copper layer as a seed layer on the surfaces of the external electrodes exposed in the openings in the insulating covering layer and the surface of the insulating covering layer by sputtering, but in Comparative Example 1, recesses were formed in the lower portion of the insulating covering layer, and a seed layer could not be formed, and therefore, the subsequent steps could not be performed. In other words, it was confirmed that when the etching step was performed, a seed layer for electrolytic plating could not be formed.

Comparative Example 2

Preparation of Base Material

First, a base material on which external electrodes and an insulating covering layer were formed was prepared as in Example 1. The material of the base material, the material and pitch Pe of the external electrodes, the material and height (height from the external electrode surface) of the insulating covering layer, and the diameter of an opening and the distance between the openings in the insulating covering layer were set as shown in Table 1.

(Electrolytic Nickel Plating)

Next, a 0.1 μm thick copper layer as a seed layer was formed on the surfaces of the external electrodes exposed in the openings in the insulating covering layer and the surface of the insulating covering layer by sputtering (see FIG. 1(*a*)). Then, a dry film was formed so as to cover the entire surface, and then, the patterning of the dry film was performed with a photoresist, and the dry film around the openings in the insulating covering layer was removed, and then, electrolytic nickel plating was performed on the surfaces of the external electrodes exposed in the openings in the insulating covering layer and part of the surface of the insulating covering layer to form UBM layers. The height of the UBM layer formed in this manner (the height from the surface of the external electrode) was as shown in Table 1. Here, the height of the UBM layer was the height from the surface of the external electrode in the central portion of the opening in the insulating covering layer.

The electrolytic nickel plating was performed using a known sulfamic acid bath. In addition, for the plating conditions, the temperature condition was set to 50° C., and the plating time and the plating current value were adjusted so that the predetermined nickel plating layer thickness was obtained.

(Electrolytic Solder Plating)

Next, electrolytic solder plating was performed on the surfaces of the UBM layers to form solder plating layers (see FIG. 1(*b*)). At this time, the solder plating layers were formed only on the upper surfaces of the UBM layers. The thickness (the height from the surface of the UBM layer) of the solder plating layer formed in this manner was as shown in Table 1 (indicated in "Tin plating layer" column).

The electrolytic solder plating was performed using a known alkanolsulfonic acid bath (Cu content: 0.5 mass %). In addition, for the plating conditions, the temperature condition was set to 50° C., and the plating time and the plating current value were adjusted so that the predetermined solder plating layer thickness was obtained.

Then, the peeling of the dry film and the removal of the unnecessary seed layer were performed to obtain a precursor substrate (see FIG. 1(*c*)).

(Reflow)

The precursor substrate obtained as described above was held in a nitrogen atmosphere (oxygen concentration 500 ppm) at 250° C. for 30 seconds to melt the solder plating layers, and further, the solder plating layers were quenched and solidified to obtain a TEG substrate comprising a terminal structure having dome-shaped bumps (see FIG. 1(*d*)). The height of the bump obtained by the reflow (the height from the surface of the external electrode 20), the diameter $L_{bm}$ when the bump was viewed from the top side, and the Ti content in the bump were as shown in Table 1.

Comparative Example 3

The terminal structure of Comparative Example 3 was fabricated as in Comparative Example 2 except that instead of electrolytic nickel plating, electroless nickel plating was performed on the seed layer (copper layer). The electroless nickel plating was performed as in Example 1.

Comparative Examples 4 and 5

The terminal structures of Comparative Examples 4 and 5 were manufactured as in Comparative Example 2 except that the elements of the terminal structure were changed to those shown in Table 1.

[Characteristics Evaluation]

(Evaluation of Bump Forming Properties)

For the terminal structures obtained in the Examples and the Comparative Examples, the evaluation of bump forming properties was performed visually as follows. Specifically, one in which adjacent bumps were independently formed and were not short-circuited was taken as OK, and one in which even one pair of adjacent bumps were short-circuited was taken as NG, and the obtained results are shown in Table 1. For Comparative Example 5, a short circuit was confirmed, and therefore, the measurement of the height of the bump, the diameter of the bump, and the Ti content in the bump described above were not performed.

(Evaluation of Strength of Bump Portions)

For the terminal structures obtained in the Examples and the Comparative Examples, the strength of the bump portions was evaluated as follows. Specifically, respective bumps (10× 10 (number)) of a pair of two TEG substrates in which daisy circuits were formed were ultrasonically bonded face-to-face by a flip chip packaging machine to fabricate a sample for the evaluation of the strength of bump portions, and the conduction properties of the daisy circuits of this sample was confirmed. One in which the daisy circuits were conducting, that is, one in which the conduction of all terminals was confirmed, was evaluated as A as one having bump portion strength capable of withstanding ultrasonic bonding, and one in which the daisy circuits were disconnected, that is, one in which the conduction of at least part of the terminals could not be confirmed, was evaluated as B as one not having bump portion strength capable of withstanding ultrasonic bonding. For Comparative Example 5 in which adjacent bumps were short-circuited, this test was not performed. The results are shown in Table 1.

(Evaluation of Entrance of UBM Layer Between External Electrode and Insulating Covering Layer)

Figure 5:
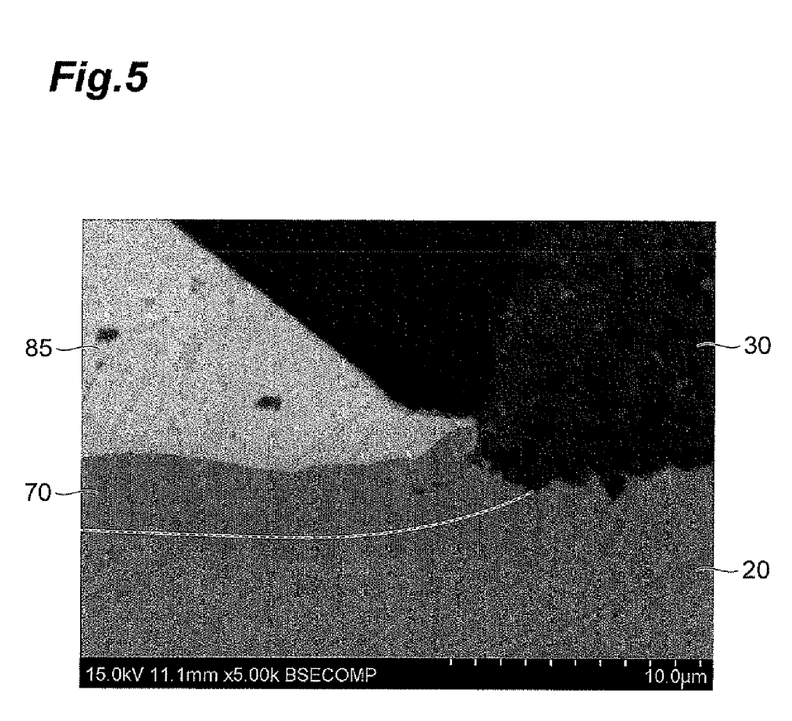
FIG. 5 is a view showing a scanning electron micrograph in which a portion in which an under bump metal layer is sandwiched between an external electrode and an insulating covering layer in the terminal structure of Example 2 is enlarged.

For the terminal structures obtained in the Examples and the Comparative Examples, whether or not the end portion (edge portion M) of the UBM layer entered between the external electrode and the insulating covering layer was observed by observing a cross section along the lamination direction using a scanning electron microscope (SEM). The results are shown in Table 1. For example, the SEM photograph of FIG. 5 is an SEM photograph in which a portion in which the UBM layer is sandwiched between the external electrode and the insulating covering layer in the terminal structure of Example 2 is enlarged. For making understanding easy, the boundary between the external electrode 20 and the UBM layer 70 is shown by a broken line in FIG. 5. In all of the terminal structures of Examples 1 to 11, the end portion of the UBM layer entered between the external electrode and the insulating covering layer in this manner, and on the other hand, in all of the terminal structures of Comparative Examples 2 to 4, such a structure was not formed. For Comparative Example 5 in which adjacent bumps were short-circuited, this test was not performed.

TABLE 1

| | Base material | External electrode | | Insulating covering layer | | | | Etching Removal thickness |
|---|---|---|---|---|---|---|---|---|
| | Material | Material | Pitch Pe | Material | Thickness | Opening diameter Lo | Distance between openings Po | |
| Example 1 | Glass epoxy substrate | Cu foil | 300 μm | Polyimide | 20 μm | 100 μm | 200 μm | 1 μm |
| Example 2 | Glass epoxy substrate | Cu foil | 300 μm | Polyimide | 20 μm | 100 μm | 200 μm | 2 μm |
| Example 3 | Glass epoxy substrate | Cu foil | 300 μm | Polyimide | 20 μm | 100 μm | 200 μm | 0.2 μm |
| Example 4 | Glass epoxy substrate | Cu foil | 300 μm | Polyimide | 20 μm | 100 μm | 200 μm | 0.2 μm |
| Example 5 | Glass epoxy substrate | Cu foil | 300 μm | Polyimide | 20 μm | 100 μm | 200 μm | 1 μm |
| Example 6 | Glass epoxy substrate | Cu foil | 150 μm | Polyimide | 20 μm | 70 μm | 80 μm | 1 μm |
| Example 7 | Glass epoxy substrate | Cu foil | 150 μm | Polyimide | 20 μm | 70 μm | 80 μm | 1 μm |
| Example 8 | Glass epoxy substrate | Cu foil | 150 μm | Polyimide | 10 μm | 70 μm | 80 μm | 1 μm |
| Example 9 | Silicon substrate | Cu plating | 100 μm | Silicon nitride | 2 μm | 30 μm | 70 μm | 1 μm |
| Example 10 | Silicon substrate | Cu plating | 40 μm | Silicon nitride | 2 μm | 10 μm | 30 μm | 1 μm |
| Example 11 | Silicon substrate | Cu plating | 40 μm | Silicon nitride | 1 μm | 10 μm | 30 μm | 0.5 μm |
| Comparative Example 1 | Glass epoxy substrate | Cu foil | 300 μm | Polyimide | 20 μm | 100 μm | 200 μm | 1 μm |
| Comparative Example 2 | Glass epoxy substrate | Cu foil | 300 μm | Polyimide | 20 μm | 100 μm | 200 μm | No |
| Comparative Example 3 | Glass epoxy substrate | Cu foil | 300 μm | Polyimide | 20 μm | 100 μm | 200 μm | No |
| Comparative Example 4 | Silicon substrate | Cu plating | 100 μm | Silicon nitride | 2 μm | 30 μm | 70 μm | No |
| Comparative Example 5 | Silicon substrate | Cu plating | 40 μm | Silicon nitride | 2 μm | 10 μm | 30 μm | No |

| | UBM layer Thickness | Tin plating layer Thickness | Bump Height | Bump Diameter | Ti content | Evaluation Bump forming properties | Bump strength | Entrance |
|---|---|---|---|---|---|---|---|---|
| Example 1 | 3 μm | 18 μm | 10 μm | 100 μm | 10 ppm | OK | A | With |
| Example 2 | 3 μm | 18 μm | 10 μm | 100 μm | 10 ppm | OK | A | With |
| Example 3 | 3 μm | 18 μm | 10 μm | 100 μm | 10 ppm | OK | A | With |
| Example 4 | 1 μm | 18 μm | 10 μm | 100 μm | 10 ppm | OK | A | With |
| Example 5 | 3 μm | 26 μm | 30 μm | 100 μm | 10 ppm | OK | A | With |
| Example 6 | 3 μm | 18 μm | 10 μm | 70 μm | 10 ppm | OK | A | With |
| Example 7 | 3 μm | 26 μm | 30 μm | 70 μm | 10 ppm | OK | A | With |
| Example 8 | 3 μm | 26 μm | 40 μm | 70 μm | 10 ppm | OK | A | With |
| Example 9 | 2 μm | 10 μm | 10 μm | 30 μm | 10 ppm | OK | A | With |
| Example 10 | 2 μm | 10 μm | 10 μm | 10 μm | 10 ppm | OK | A | With |
| Example 11 | 2 μm | 10 μm | 10 μm | 12 μm | 10 ppm | OK | A | With |
| Comparative Example 1 | | Seed layer cannot be formed | | | | — | — | — |
| Comparative Example 2 | 3 μm | 25 μm | 10 μm | 150 μm | Not detected | OK | B | Without |
| Comparative Example 3 | 3 μm | 25 μm | 10 μm | 150 μm | Not detected | OK | B | Without |
| Comparative Example 4 | 2 μm | 15 μm | 13 μm | 60 μm | Not detected | OK | B | Without |
| Comparative Example 5 | 2 μm | 15 μm | Not evaluated due to short circuit | | | NG | — | — |

As shown in the above evaluation results, in all of the terminal structures of Examples 1 to 11, the end portion of the UBM layer 70 entered between the external electrode 20 and the insulating covering layer 30, and the diameter of the bump 85 was equal to the diameter of the opening 35 in the insulating covering layer 30, and the bump 85 was formed in the region in the opening 35. It was confirmed that according to the terminal structures of Examples 1 to 11 having such a structure, the bump portions had good strength.

On the other hand, in Comparative Example 1, in the first place, the formation of bumps was not possible. In addition, in the terminal structures of Comparative Examples 2 to 4, the UBM layer did not enter between the external electrode and the insulating covering layer, and the bump was not formed in the region of the opening, and in addition, the bump did not contain Ti. It became clear that in such terminal structures of Comparative Examples 2 to 4, the strength of the bump portions was insufficient. In the evaluation of the strength of the bump portions, when the terminal structures in which the daisy circuits were disconnected were inspected in detail, the UBM layers had peeled off the external electrodes in all of the terminal structures.

DESCRIPTION OF SYMBOLS

10 . . . base material; 12 . . . precursor substrate; 20 . . . external electrode; 30 . . . insulating covering layer; 35 . . . opening; 40 . . . seed layer; 50, 70 . . . UBM layer; 60 . . . solder plating layer; 80 . . . tin plating layer; 65, 85 . . . bump; 100 . . . dry film.

What is claimed is:

1. A terminal structure comprising:
    a base material;
    an external electrode formed on the base material;
    an insulating covering layer formed on the base material and on the external electrode and having an opening exposing at least part of the external electrode;
    an under bump metal layer containing Ni, filling the opening on the external electrode; and
    a dome-shaped bump containing Sn, covering the under bump metal layer, wherein
    at least part of the under bump metal layer has a portion sandwiched between the external electrode and the insulating covering layer.

2. The terminal structure according to claim 1, wherein the under bump metal layer has a portion sandwiched between the external electrode and the insulating covering layer over an entire outer periphery thereof.

3. The terminal structure according to claim 1, wherein the bump further contains Ti.

4. A semiconductor element comprising the terminal structure according to claim 1.

5. A module substrate comprising the terminal structure according to claim 1.

* * * * *